United States Patent [19]
Yagi et al.

[11] 4,038,680

[45] July 26, 1977

[54] SEMICONDUCTOR INTEGRATED CIRCUIT DEVICE

[75] Inventors: Hajime Yagi, Tokyo; Tadaharu Tsuyuki, Isehara, both of Japan

[73] Assignee: Sony Corporation, Tokyo, Japan

[21] Appl. No.: 654,758

[22] Filed: Feb. 3, 1976

Related U.S. Application Data

[63] Continuation-in-part of Ser. No. 561,914, March 25, 1975, which is a continuation-in-part of Ser. No. 427,648, Dec. 26, 1973, abandoned, and a continuation-in-part of Ser. No. 620,293, Oct. 7, 1975, which is a continuation-in-part of Ser. No. 427,647, Dec. 26, 1973, abandoned.

[30] Foreign Application Priority Data

| Dec. 29, 1972 | Japan | 47-550 |
| Mar. 28, 1974 | Japan | 49-35307 |
| Oct. 31, 1974 | Japan | 49-125869 |
| Dec. 29, 1972 | Japan | 47-551 |
| Oct. 31, 1974 | Japan | 49-125868 |
| Feb. 8, 1975 | Japan | 50-16561 |

[51] Int. Cl.$^2$ .............. H01L 27/02; H01L 29/72; H01L 27/04

[52] U.S. Cl. .................. 357/44; 357/40; 357/34; 357/48; 357/89

[58] Field of Search .......... 357/40, 44, 48, 89, 357/34

[56] References Cited

U.S. PATENT DOCUMENTS

| 3,868,722 | 2/1975 | Le Can et al. | 357/44 |
| 3,930,909 | 1/1976 | Schmitz et al. | 357/44 |

Primary Examiner—Edward J. Wojciechowicz
Attorney, Agent, or Firm—Hill, Gross, Simpson, Van Santen, Steadman, Chiara & Simpson

[57] ABSTRACT

A semiconductor integrated circuit device having a construction of complementary PNP-NPN semiconductor devices in a monolithic integrated form. First and second N type epitaxial layers are formed on a common P type semiconductor substrate. A base region of the PNP transistor is produced by the diffusion of an impurity into the second epitaxial layer. The NPN transistor is formed as low emitter concentration type transistor and a part of the second epitaxial layer serves as the emitter region of the NPN transistor.

5 Claims, 38 Drawing Figures

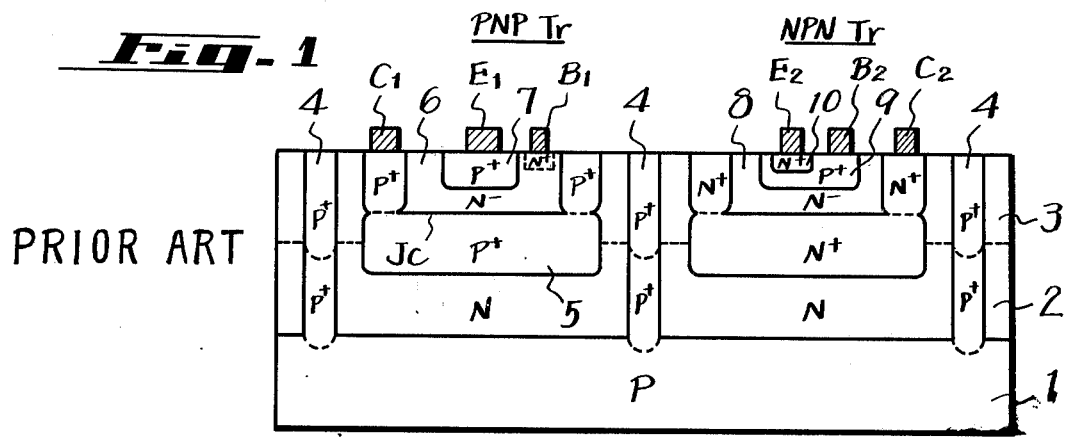
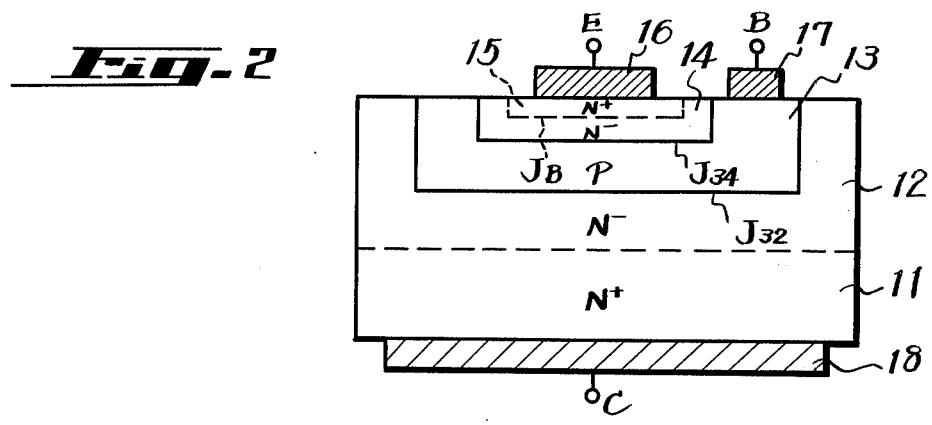
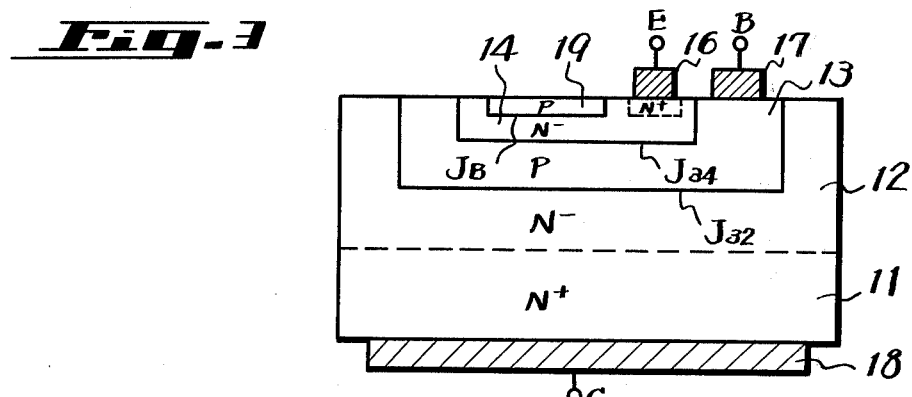
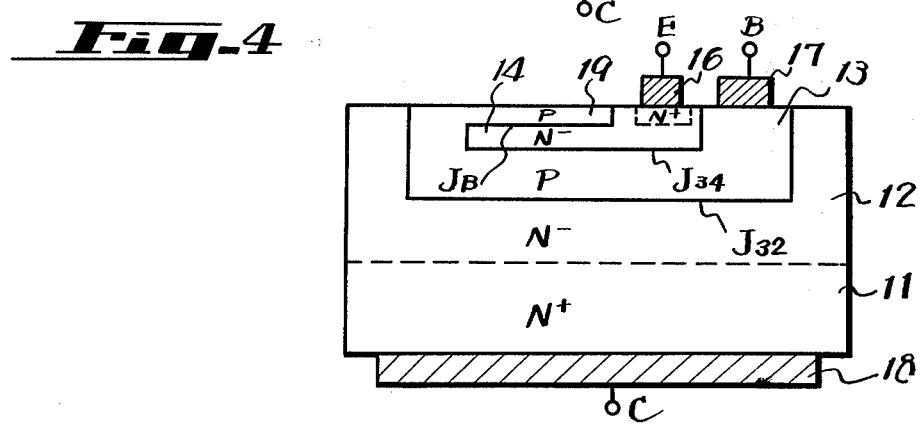

PNP Tr1    NPN Tr2

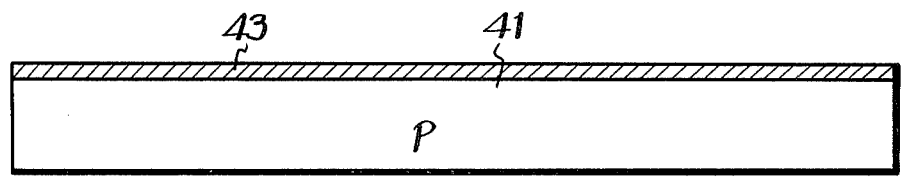
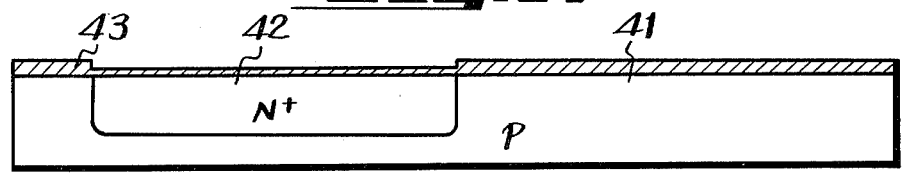
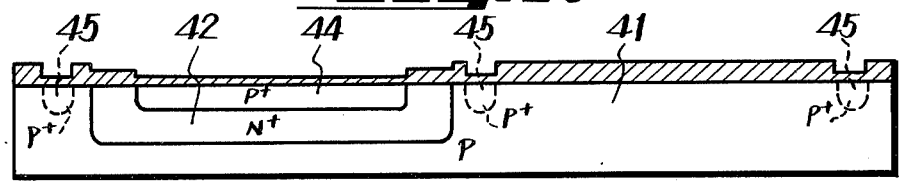
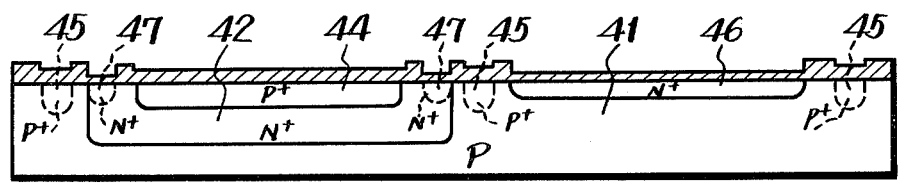
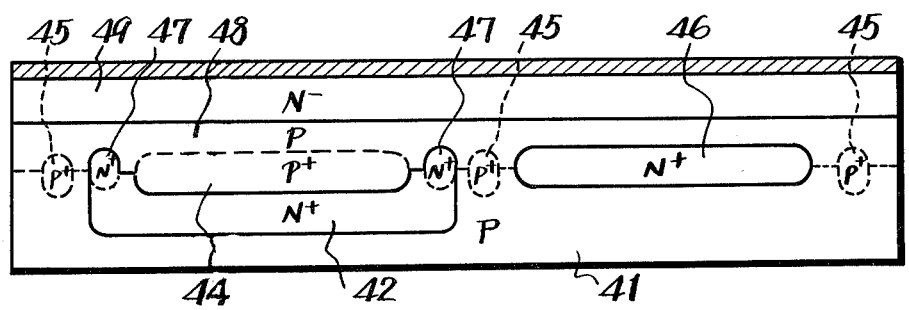

PNP Tr1     NPN Tr2

SEMICONDUCTOR INTEGRATED CIRCUIT DEVICE

RELATED APPLICATIONS

This application is a continuation-in-part of our copending application, Ser. No. 561,914, filed 3-25-75 which in turn was a continuation-in-part of our application, Ser. No. 427,648, filed 12-26-73 which application Ser. No. 427,648 is now abandoned. This application is also a continuation-in-part of our copending application, Ser. No. 620,293, filed 10-7-75 which in turn is a continuation-in-part of our application, Ser. No. 427,647 filed 12-26-73 which application Ser. No. 427,647 is now abandoned. All of the above applications are assigned to the same assignee as the present invention.

BACKGROUND OF THE INVENTION

1. Field of the Invention

This invention relates generally to a semiconductor device, and more particularly pertains to a semiconductor integrated circuit device having PNP type and NPN type transistor structures incorporated in a common semiconductor substrate.

2. Description of the Prior Art

Generally, in a semiconductor integrated circuit device containing complementary transistors or NPN type and PNP type transistors, it is difficult to provide a so-called high property PNP transistor which is high in withstanding voltage and high frequency characteristics as compared with an NPN type transistor. In other words, such a semiconductor integrated circuit device having complementary transistors is constructed as shown in, for example, FIG. 1. That is, a P type semiconductor substrate 1 is prepared, first and second N type epitaxial growth layers 2 and 3 are sequentially formed on the substrate 1, P type and N type layers are embedded in regions which are separated by P type isolation regions 4, thus a PNP type transistor PNP Tr having a collector 5, a base 6 and an emitter 7 is formed in one region and an NPN type transistor NPN Tr having a collector 8, a base 9 and an emitter 10, respectively is formed in another region. Further, in FIG. 1; $C_1$, $B_1$ and $E_1$ designate collector, base and emitter electrodes of the PNP type transistor PNP Tr, while $C_2$, $B_2$ and $E_2$ indicate collector, base and emitter electrodes of the NPN type transistor NPN Tr, respectively. However, in such a case where the PNP type transistor has the base region made in the epitaxial grown layer, the base region 6 is low in impurity concentration, so that the current characteristic of its current amplification factor $h_{FE}$ is low. In order to improve such a defect, it is preferred that the impurity concentration profile of base and emitter regions of the PNP type transistor be formed as a double diffusion type. However, this is difficult in a semiconductor integrated circuit. Further, since the emitter region 7 and collector region 5 of the PNP type transistor are high in impurity concentration while its base region 6 is low in impurity concentration, the depletion layer from a collector junction $J_C$ is expanded mainly to the base region 6 upon operation of the PNP type transistor PNP Tr, and hence its withstanding voltage is determined by punch-through and a high withstanding voltage transistor can not be formed.

It is sufficient for making the withstanding voltage of the transistor high, if the base width thereof is selected wide. However, since the frequency characteristic of the transistor is determined mainly by the base width, the withstanding voltage of the transistor can be improved only be causing its cut-off frequency $f_T$ to be deteriorated. In order to avoid the deterioration of the cut-off frequency $f_T$, it may be considered that an N type impurity of relatively high concentration is diffused into, for example, the base region 6 of low impurity concentration to form a base region of high concentration and the base width is made narrow by carrying the emitter diffusion deep. However, in such a case, the collector region 5 is of high concentration, so that the withstanding voltage across the collector junction $J_C$ is deteriorated.

SUMMARY OF THE INVENTION

According to an aspect of the present invention, there is provided a semiconductor integrated circuit device which comprises a semiconductor substrate of a first conductivity type, an epitaxial growth layer of a second conductivity type formed on said substrate, a first region of the first conductivity type which faces the major surface of said epitaxial growth layer; a second region of the second conductivity type made of said epitaxial growth layer surrounded by said first region, a diffusion region of the second conductivity type formed in said second region, a third region of the first conductivity type formed in said diffusion region, a fourth region of the second conductivity type made of said epitaxial growth layer which faces the surface of said epitaxial growth layer and is isolated through a PN junction from said first region, a fifth region of the first conductivity type formed in said fourth region, and a sixth region of the second conductivity type made of said epitaxial growth layer surrounded by said fifth region.

Accordingly, it is an object of this invention to provide a semiconductior integrated circuit device which has provided with a PNP type transisor high in withstanding voltage and good in current and frequency characteristics of current amplification factor $h_{FE}$ and a complementary transistor of high property.

It is another object of the invention to provide a semiconductor integrated circuit device in which a low emitter concentration (LEC) transistor already developed as a complementary transistor by the same applicant can be used.

The other objects, features and advantages of the present invention will become apparent from the following description taken in conjunction with the accompanying drawings.

BRIEF DESCRIPTION OF THE DRAWINGS

FIG. 1 is a simplified cross-sectional view of one form of prior art complementary transistors formed in a common semiconductor substrate;

FIGS. 2 through 4, are cross-sectional views of LEC transistors;

FIGS. 6A through 6L, and FIGS. 7A through 7J are cross-sectional views of other type complementary transistors of the present invention at successive stages in the fabrication process thereof.

DESCRIPTION OF THE PREFERRED EMBODIMENTS

Figure 5A:
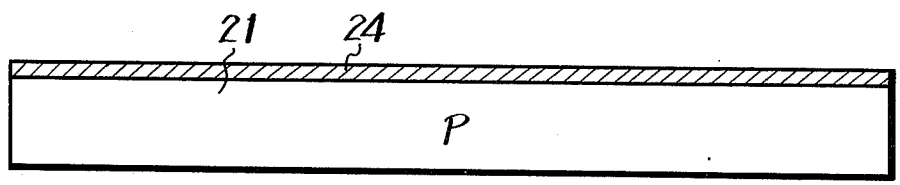
FIGS. 5A through 5L are cross-sectional views of complementary transistors of the present invention at successive stages in the fabrication process thereof.

For better understanding the present invention, a low emitter concentration (LEC) transistor will be described with reference to FIG. 2. By way of example, an NPN type transistor will be described. An N type semiconductor substrate 11 of high impurity concentration is prepared, an N type semiconductor layer 12 of low impurity concentration is formed on the substrate 11 by epitaxial growth which is a first region. A second region 13 of a P type conductivity is formed adjacent to and surrounded by the first region 12. A third region 14 of an N type whose impurity concentration is substantially the same as or sufficiently lower than that of the second region 13 is formed adjacent to and surrounded by the second region 13, and a potential barrier $J_B$ is formed in the thrid region 14 such that the barrier $J_B$ opposes a PN junction $J_{34}$ formed between the regions 14 and 13 and the distance between the barrier $J_B$ and the region 13 is selected smaller than the diffusion distance of minority carriers in the region 14. The potential barrier $J_B$ has, for example, the same conductivity type as that of the region 14, but an N type region 15 of impurity concentration sufficiently higher than that of the region 14 is formed therein to make an LH junction which is formed as the potential barrier. The term "LH junction" as used herein refers to the interface between a region of low impurity concentration and a region of high impurity concentration of the same type.

Thus, an NPN type transistor is constructed whose emitter region is made of the region 14 and whose collector region is made of the region 12, respectively. In FIG. 2, the numerals 16, 17 and 18 designate emitter, base and collector electrodes, respectively, and E, B and C designate terminals led out therefrom. If voltages are supplied to the electrodes 16, 17 and 18 to apply a forward bias to the PN junction between the regions 14 and 13, i.e., to the emitter junction $J_{34}$ and to apply a backward bias to the PN junction between the regions 13 and 12, i.e., to collector junction $J_{32}$, the electrons injected from the emitter region 14 to the base region 13 can reach the collector region 12 by selecting the distance between the PN junctions $J_{34}$ and $J_{32}$ smaller than the diffusion length of minority carriers in the region 13. Thus, the transistor operation can be performed. In this case, the emitter injection efficiency $\gamma$ is expressed as follows:

$$\gamma = \frac{\text{majority carrier current in emitter}}{\text{majority carrier current in emitter} + \text{minority carrier current in emitter}}$$

Therefore, in order to increase the factor $h_{FE}$ or $\gamma$, it is sufficient that if the carriers injected to the base or the current caused by the diffusion of electrons is constant in FIG. 2, the carrier injected from the region 13 to the emitter region 14 or hole current is decreased as much as possible. With the transistor shown in FIG. 2, the barrier $J_B$ or LH junction exists in opposed relation to the PN junction $J_{34}$ and the barrier $J_B$ will become a potential barrier of about 0.2 eV against the holes when the impurity concentration in the low concentration part of the region 14 is selected as $10^{15}$ cm$^{-3}$ and that in the region 15 is selected as $10^{20}$ cm$^{-3}$, by way of example. Thus, the minority carriers injected from the region 13 to the region 14 are repelled by the barrier $J_B$, so that concentration gradient in the region 14 becomes flat and the injection of carriers (holes) from the region 13 to the region 14 is suppressed. As a result, the injection efficiency $\gamma$ is improved and hence the factor $h_{FE}$ becomes high. Further, since the impurity concentration is selected low in the portion where the PN junctions $J_{34}$ and $J_{32}$ which serve as emitter and collector junctions are formed, crystal defects are reduced and the factor $h_{FE}$ is sufficiently high as compared with that of an ordinary high concentration emitter type transistor.

In the example shown in FIG. 2, the region 15 is formed in the third region 14 to provide the LH junction and hence the barrier $J_B$ therewith, but it is possible that, as shown in FIG. 3, a fourth region 19 which is different in conductivity from the third region 14 is formed therein to provide a PN junction and hence the barrier $J_B$. In such a case, the minority carriers injected from the region 13 to the region 14 moves to the region 19, the potential of the region 19 becomes approximately the same as that of the region 13, the concentration gradient of holes in the region 14 is made flat by re-injecting holes from the region 19 to the region 14 to reduce the hole diffusion current, and hence the emitter injection efficiency $\gamma$ is enhanced to increase the factor $h_{FE}$.

In the example shown in FIG. 3, the region 19 is formed in the region 14 electrically isolated from the region 13, but it is possible that, as shown in FIG. 4, the region 19 be formed such tht it is electrically connected in part to the region 13.

Since in FIGS. 3 and 4 the same reference numerals and letters as those of FIG. 2 represent the same elements, their description will be omitted for the sake of brevity.

In the semiconductor device of this invention which has complementary transistors, one of the complementary transistors or NPN type transistor is preferably formed as the above mentioned LEC transistor.

With reference to FIG. 5 or FIGS. 5A to 5L, an embodiment of the semiconductor integrated circuit devices according to the present invention will be now described together with its manufacture. in this example, an NPN type transistor is formed as a LEC transistor.

Figure 5B:
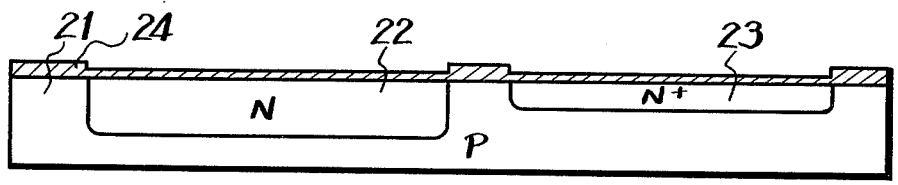

Beginning with FIG. 5A, a semiconductor substrate 21 of a P type conductivity whose specific resistance is selected about 15 Ω-cm (impurity concentration of $1 \times 10^{15}$ cm$^{-3}$) is prepared. Then, an embedded layer 22 of an N type conductivity whose impurity concentration is selected as, for example, about $5 \times 10^{15}$ cm$^{-3}$ is formed by diffusion in the substrate 21 from its one major surface at the position where a PNP type transistor will be formed later, while an embedded layer 23 of an N type conductivity whose impurity concentration is selected as, for example, about $1 \times 10^{19}$ cm$^{-3}$ is formed by diffusion in the substrate 21 from the major surface thereof at the position where an NPN type transistor will be formed later (FIG. 5B). In the figures, 24 indicates an insulating layer made, for example, of silicon dioxide SiO$_2$.

Figure 5C:
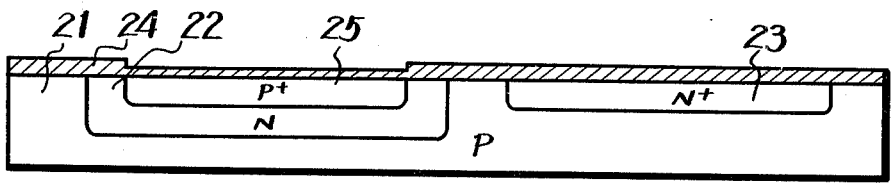
Figure 5D:
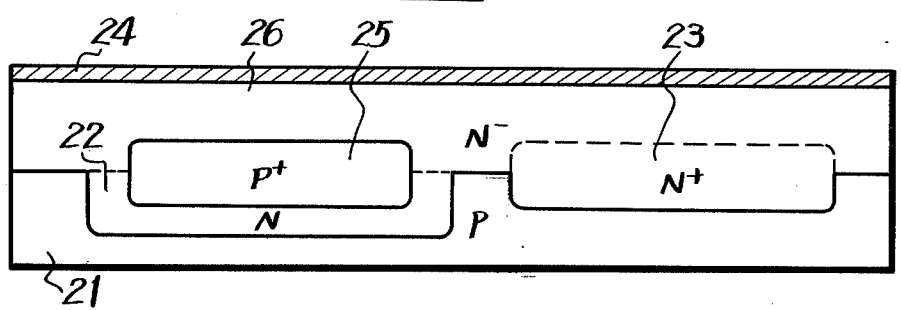

Then, a diffusion window is formed through the SiO$_2$ layer 24 on the N type embedded layer 22 by photoetching the SiO$_2$ layer 24, and a P type impurity is diffused in the N type layer 22 through the window to form a P type embedded layer 25 (whose impurity concentration is selected, for example, about $1 \times 10^{19}$ cm$^{-3}$) which will serve as the collector embedded layer of the PNP type transistor (FIG. 5C). Thereafter, a first epitaxial growth layer 26 whose specific resistance is selected as, for example, about 10 Ω-cm is formed to cover all the upper surface of the substrate 21 (FIG. 5D).

Figure 5E:
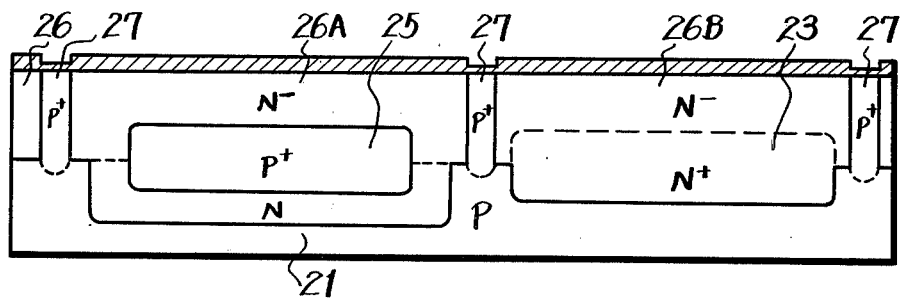
Figure 5F:
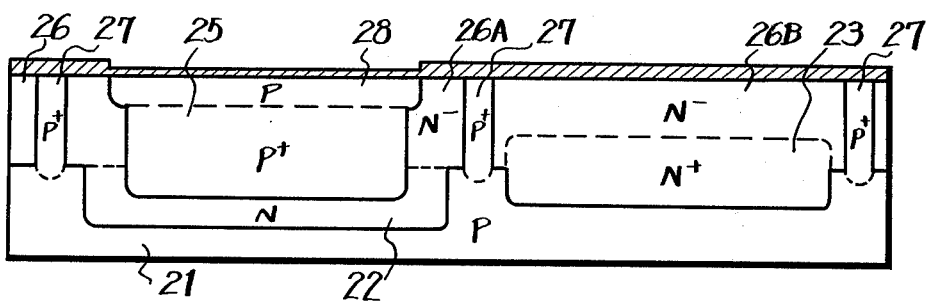
Figure 5G:
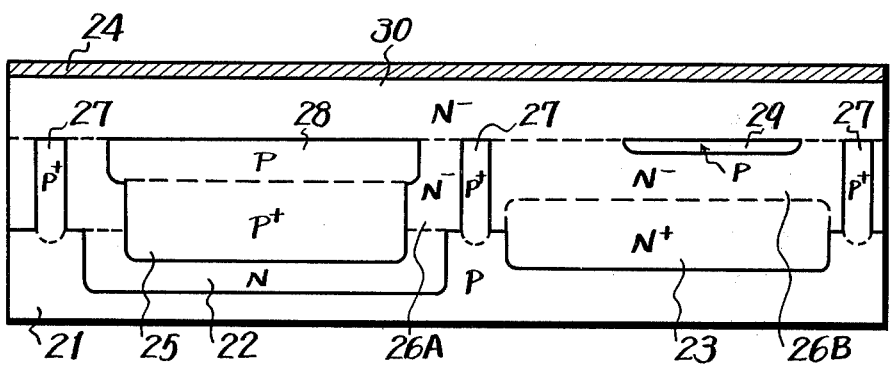

Then, a photo-etching treatment is carried out for the SiO$_2$ layer 24 to form therethrough a diffusion window in a lattice pattern, which window will be used to form an isolation region of a lattice patter viewed from the upper side, at the positions to isolate the parts where the PNP and NPN type transistors are to be formed. A P type impurity is diffused through the window into the substrate 21 through the epitaxial layer 26 to form P type isolation regions 27 (FIG. 5E).

A P type region 28, whose impurity concentration is lower than that of the P type embedded layer 25 or, for example, about $5 \times 10^{15} cm^{-3}$, is formed by diffusion in one of the regions of the first epitaxial layer 26 isolated by the isolation region 27 or region 26A where the PNP transistor is to be formed. In this case, the P type region 28 is selected to reach the P type embedded layer 25. Then, a P type region 29 is formed by, for example, the ion implantation in the other region or region 26B where the NPN type transistor is to be formed. This P type region 29 finally serves as the base region of the NPN transistor of an LEC type. Thereafter, a second epitaxial growth layer 30 of an N type is formed on the first epitaxial growth layer 26. In this case, the impurity concentration of the second epitaxial growth layer 30 is selected, for example, to be about $5 \times 10^{15} cm^{-3}$ (Refer to FIGS. 5F and 5G, respectively).

Figure 5H:
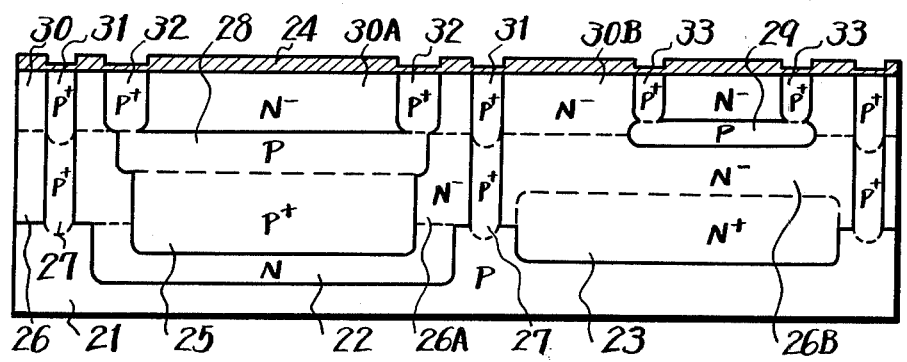

Then, a P type impurity of high concentration is selectively diffused in the second epitaxial growth layer 30 to form isolation regions 31 for isolating the parts where the PNP and NPN type transistors are to be formed. In this case, the isolation regions 31 reach the isolation regions 27 in the lower layer. At the same time, P type regions 32 and 33, which are annular when viewed from the above, are formed in regions 30A and 30B of the second epitaxial growth layer 30 isolated by the isolation regions 31, respectively. The P type regions 32 and 33 are so formed that they reach the P type regions 28 and 29, respectively (FIG. 5H).

Figure 5I:
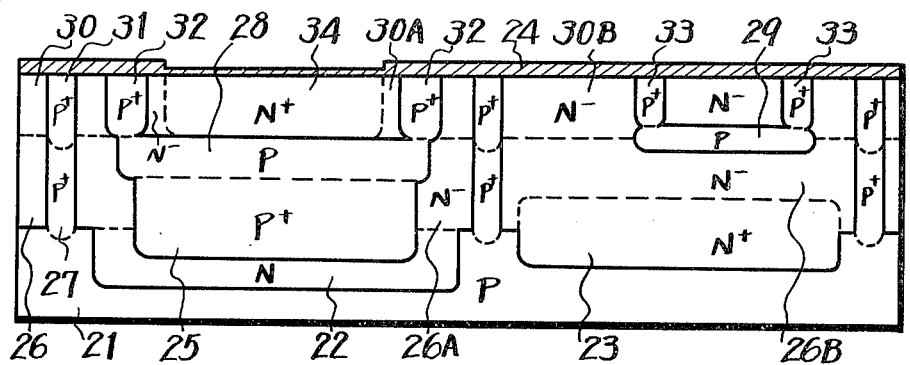

An N type diffusion region 34, which will serve finally as the base region of the PNP type transistor, is formed in the N type region 30A of low impurity concentration which is formed of the second epitaxial growth layer 30 and surrounded by the P type region 32. The N type diffusion region 34 contacts with the P type region 28 and has the impurity concentration higher than that of the P type region 28, for example, about $1 \times 10^{18} cm^{-3}$ (FIG. 5I).

Figure 5J:
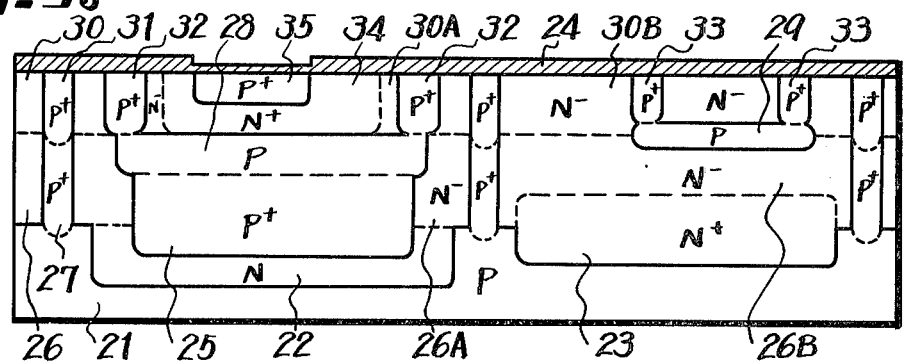
Figure 5K:
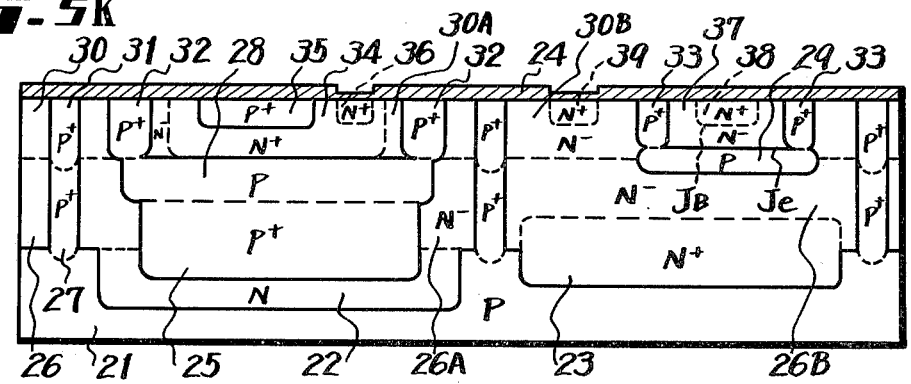

A P type region 35 of the impurity concentration of, for example, about $1 \times 10^{20} cm^{-3}$, which will serve as the emitter region of the PNP transistor, is formed in the N type diffusion region 34 (FIG. 5J). Then, an N type impurity of high concentration is selectively diffused in the region 34 to form therein a high impurity concentration region 36 which serves for leading out the base electrode. At the same time, an N type region 38 of high impurity concentration is formed in an N type low impurity concentration region 37 which exists in the region 30B made of the second epitaxial growth layer 30, is surrounded by the P type region 33 and will serve as the emitter region of the NPN transistor and a high impurity concentration region 39 of N type is also formed in the region 30B which is not surrounded by the P type region 33. The region 39 will serve for leading out the collector electrode of the NPN transistor. In this case, the region 38 serves for deriving the emitter electrode as well as becomes an additional region which form an LH junction $J_B$ with the low concentration region 37. This LH junction $J_B$ acts as a potential barrier for the minority carriers in the region 37. Further, the LH junction $J_B$ faces a junction $J_e$ formed between the regions 37 and 29 and is formed at such a location that the distance between the junction $J_B$ and $J_e$ is smaller than the diffusion length of the minority carriers in the region 37 (FIG. 5K).

Thereafter, collector, emitter and base electrodes $C_1$, $E_1$ and $B_1$ of the PNP transistor are formed on the region 32, 35 and 36, respectively. Further, collector, base and emitter electrodes $C_2$, $B_2$ and $E_2$ of the NPN transistor are formed on the region 39, 33 and 38, respectively (FIG. 5L).

Figure 5L:
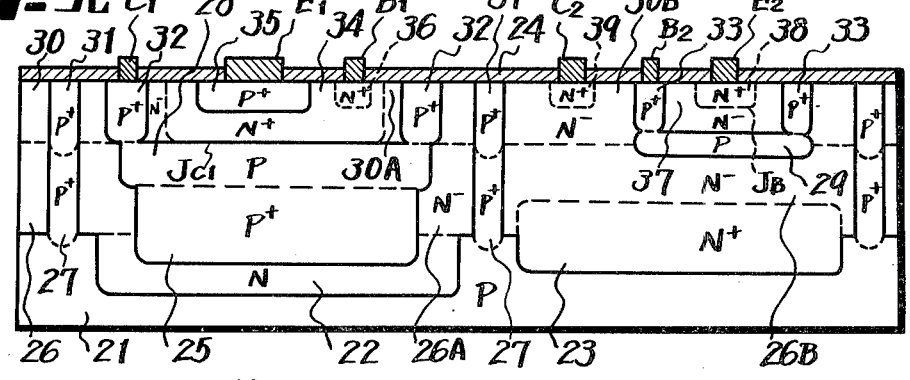

Thus, as shown in FIG. 5L, in the first island region isolated by the isolation regions 27 and 31, there is formed the PNP type transistor PNP $Tr_1$ whose collector region is made of the P type regions 25 and 28, whose base region is made of the N type diffusion region 34 and whose emitter region is made of the P type region 35, while in the second island region there is formed the NPN transistor NPN $Tr_2$ whose collector region is made of the N type regions 26B and 30B which are formed in the first and second epitaxial growth layers, whose base region is formed by the P type region 29 which is formed by ion implantation, and whose emitter region is made of the N type low concentration region 37 which is formed in the second epitaxial growth layer and has the LH junction $J_B$. Thus, a semiconductor integrated circuit device comprising desired complementary transistors is obtained.

With the semiconductor integrated circuit device of the invention described above, the NPN type transistor, which is superior in withstanding voltage, current characteristic and high frequency characteristic of the factor $h_{FE}$, and also the PNP type transistor, which is similarly superior in the same characteristics, are both obtained. That is, it is already known that an NPN transistor of high property is obtained, so that is description will be omitted. In the PNP transistor PNP $Tr_1$, the P type region 28 made in the first epitaxial growth layer 26 by low impurity concentration diffusion is used as the collector region of the PNP transistor, and the base region 34 and emitter region 35 thereof are formed in the second epitaxial growth layer 30 by a so-called double diffusion, so that the base width becomes narrow and hence a high cut-off frequency $f_T$ is obtained. Thus, the PNP transistor is improved in high frequency characteristic and the current characteristic of its factor $h_{FE}$. Accordingly, this PNP transistor can be used as a high power transistor. Since the collector region 28 contacting with the base region 34 is of low impurity concentration, the depletion layer of the collector junction $J_{C1}$ expands to the collector region 28 mainly. Thus, a punch-through for the emitter region 35 is avoided, and accordingly, the withstanding voltage thereof is improved. If the PNP transistor has the impurity concentration profile of FIGS. 5A to 5L, its cut-off frequency $f_T$ can be made more than 100 MHz, its withstanding voltage more than 50 V, and its collector saturation resistance low.

In addition, the PNP transistor PNP $Tr_1$ can coexist with the high property NPN transistor NPN $Tr_2$ of the LEC type. At present, a desired semiconductor integrated circuit device including a LEC type NPN transistor requires two types of epitaxial growths, so that if the PNP transistor PNP $Tr_1$ of this invention is contained in the semiconductor integrated circuit device, there is no need to increase the number of epitaxial growth steps.

Although not shown, the P type region 28 of low impurity concentration shown in FIG. 5 can be formed in such a manner that a P type impurity of high diffusion speed, for example, aluminum can be diffused into the second epitaxial growth layer 30 from its surface after the first and second epitaxial growth layers 26 and 30 are formed. In this case, a triple diffusion is carried out in consideration of the base region 34 and the emitter region 35.

Another embodiment of the present invention will be described with reference to FIG. 6 or FIGS. 6A to 6L, which are substantially the same as that of FIG. 5 in construction but different in the method of making it.

As shown in FIG. 6A, a P type semiconductor substrate 41 whose specific resistance is selected as, for example, 3 ~ 5 Ω-cm is prepared.

Then, an N type embedded layer 42, whose doping amounts to about $2 \times 10^{12}$ cm$^{-2}$, is formed for example, by ion implantation in ths substrate 41 from its one major surface at the location where a PNP type transistor will be formed later. In the figure, 43 indicates an insulating layer made, for example, of SiO$_2$ (FIG. 6B).

Thereafter, a P type region 44 of relatively high impurity concentration and a P type isolation region 45 of relatively high impurity concentration, which has a lattice shape when viewed from the upper side, are formed in the N type embedded region 42 and the substrate 41 at the positions for isolating PNP and NPN transistor, which will be formed finally, respectively. The P type region 44 will become the collector embedded layer of the PNP transistor. It is preferable that the sheet resistance $\rho_S$ of the P type region 44 and P type isolation regions 45 be selected, for example, to be about 250 Ω/□ (FIG. 6C).

An N type embedded layer 46 of relatively high impurity concentration is formed by diffusion in the substrate 41 at its part surrounding by the isolation regions 45 where the NPN transistor will be formed. At the same time, an N type region 47 for isolation is formed in the N type region 42 at the location to surround the P type region 44 (FIG. 6D). It may be possible that the sheet resistance $\rho_S$ of the N type embedded layer 46 and the N type region 47 for isolation can be selected to be, for example, about 5 Ω/□.

Then, a first epitaxial growth layer 48 of P type, whose specific resistance is, for example, about 5 Ω-cm and whose thickness is about 8μ(micron), and a second epitaxial growth layer 49 of N type, whose specific resistance is, for example, 2 Ω-cm and whose thickness is about 4μ, are formed sequentially on the substrate 41 (FIG. 6E).

Figure 6F:
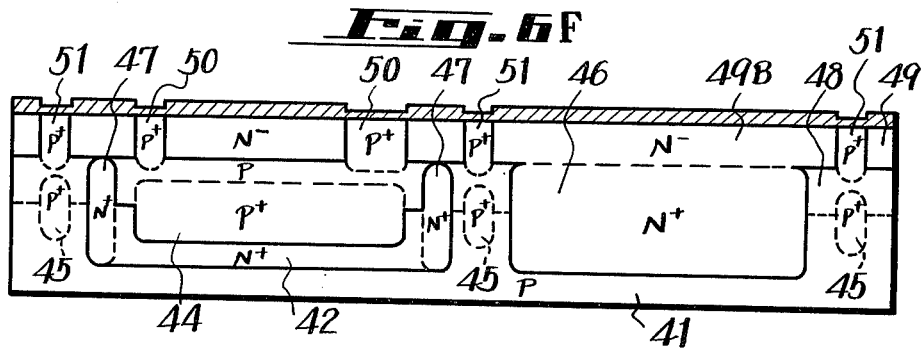

A P type impurity of relatively high concentration is selectively diffused into the second epitaxial growth layer 49 from its surface to form a P type region 50, which is annular when viewed from the upper side and reaches the first epitaxial growth layer 48, at the location opposing the P type region 44 and a P type isolation region 51 which is of lattice shape when viewed from the upper side and reaches the first epitaxial growth layer 48 at the location opposing the P type region 45. At the same time, the N type embedded layer 46 and the N type region 47 for isolation are again diffused and arrive at the second epitaxial growth layer 49 through the first epitaxial growth layer 48 (FIG. 6F).

Figure 6G:
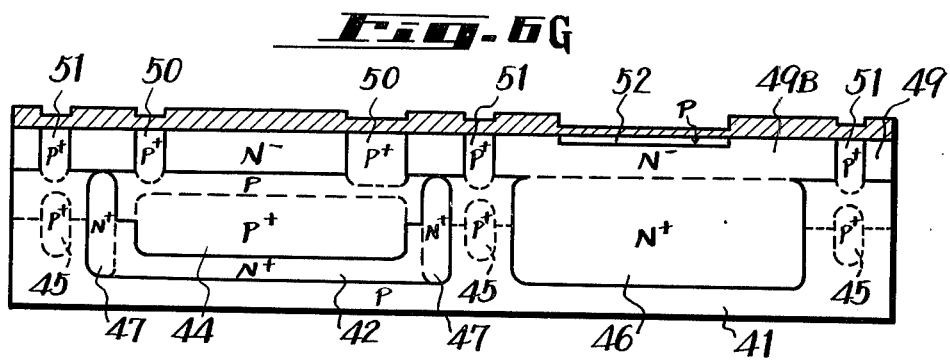

A P type region 52, which will serve as the base region of the NPN transistor, is formed by, for example, ion implantation (at a doping amount of, for example, about $1 \times 10^{13}$ cm$^{-2}$) in a region 49B made of the second epitaxial growth layer 49 defined by the P type isolation region 51 (FIG. 6G).

Figure 6H:
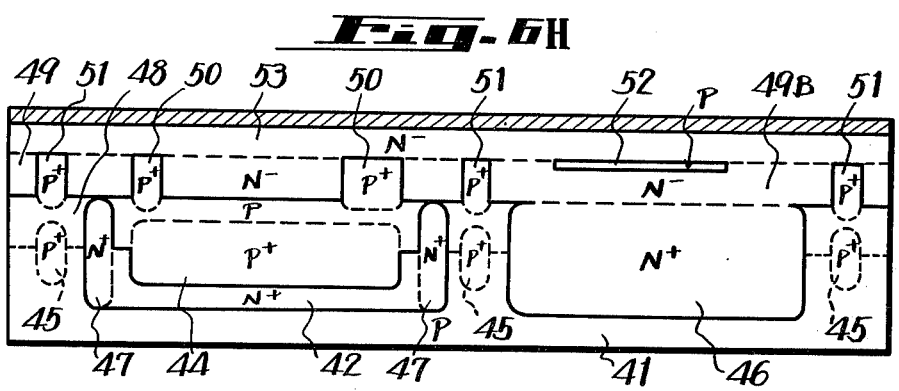

Thereafer, a third epitaxial growth layer 53 of N type, whose specific resistance is selected to be about 2 Ω-cm, is formed on the second epitaxial growth layer 49 (FIG. 6H).

Figure 6I:
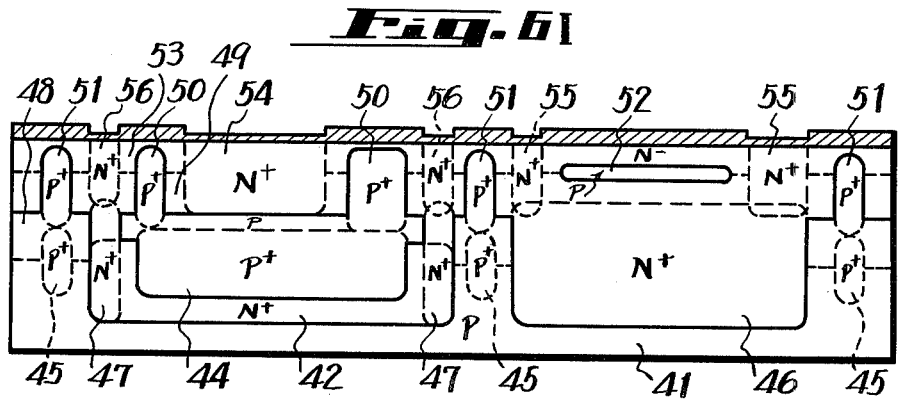

Then, an N type diffusion region 54, which will serve as the base region of the PNP transistor and reaches the first epitaxial growth layer 48, is formed by selectively diffusing an N type impurity into the third epitaxial growth layer 53 from its surface at the location where the base region of the PNP transistor will be formed. An N type region 55, which surrounds the P type region 52 to be served as the base of the NPN transistor and is connected to the N type embedded layer 46, is formed by selectively diffusing an N type impurity into the third epitaxial growth 53 at the location where the collector region of the NPN transistor will be formed. An N type isolation region 56 is formed by selectively diffusing an N type impurity into the third epitaxial growth layer 53 at the location corresponding to the N type isolation region 47 to which the N type isolation region 56 reaches. In this case, it is possible that the sheet resistance $\rho_S$ of the respective regions 54, 55 and 56 be selected as about 120 Ω/□ (FIG. 6I). At this time, the regions 45 and 51 become connected to each other.

Figure 6J:
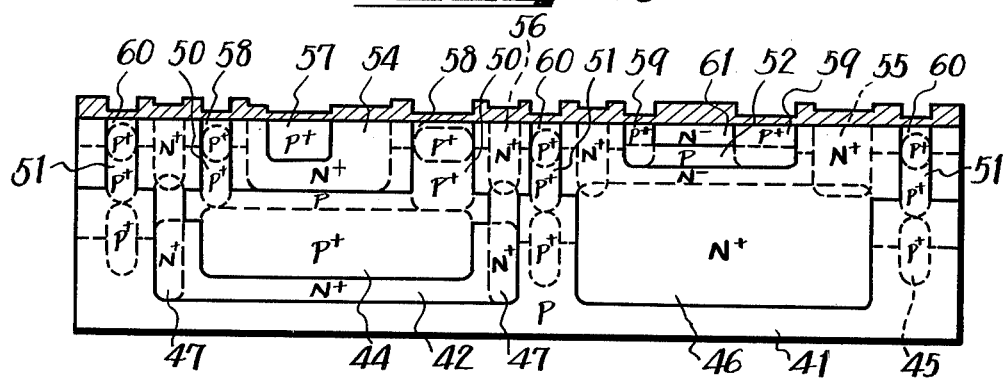

Then, a P type impurity is selectively diffused into the respective regions at high concentration to form a P type region 57 in the N type region 54 which region 57 will serve as the emitter region of the PNP transistor; a P type region 58 of high concentration which is connected to the P type region 50 and will serve as the region for leading out the collector electrode of the PNP transistor; a P type region 59 of high concentration which will serve as the region for leading out the base electrode of the NPN transistor; and a P type isolation region 60 which is connected to the P type region 51. In this case, it is possible that the sheet resistance $\rho_S$ of the respective regions 57, 58, 59 and 60 is selected as about 10 Ω/□ (FIG. 6J).

Figure 6K:
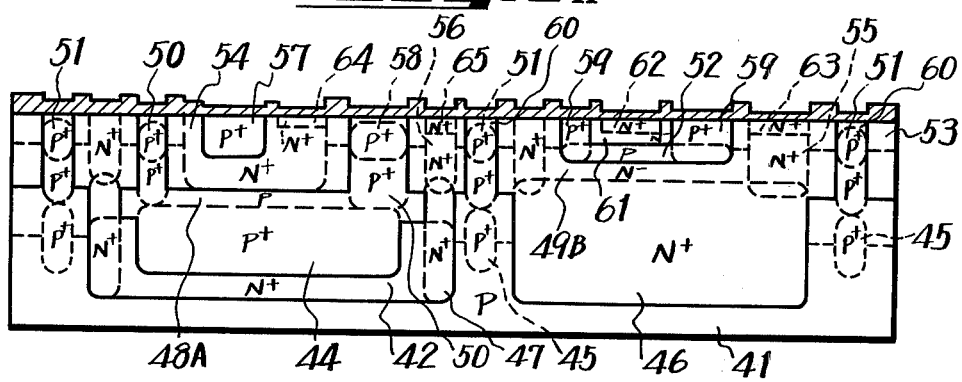

An N type impurity of high concentration is selectively diffused to form an N type region 62 of high concentration in the N type region 61, which is made of the third epitaxial growth layer 3, will serve as the low emitter concentration region of the NPN transistor and forms the LH junction with the region 62; an N type region 63 of high concentration, which will serve for leading out the collector electrode of the NPN transistor, in the N type region 55; an N type region 64 of high concentration, which will serve for leading out the base electrode of the PNP transistor, in the N type diffusion region 54 which will serve as the base region of the PNP transistor; and an N type region 65 of high concentration in the N type isolation region 56, which will serve for leading out the isolation electrode, respectively. In this case, it is possible that the sheet resistance $\rho_S$ of the respective regions 62, 63, 64 and 65 can be selected as, for example, about 10 Ω/□ (FIG. 6K).

Thereafter, on the regions 57, 64 and 58, there are formed an emitter electrode $E_1$, a base electode $B_1$ ‘and a collector electrode $C_1$ of the PNP transistor, respectively, while on the regions 62, 59 and 63, there are formed an emitter electrode $E_2$, a base electrode $B_2$ and a collector electrode $C_2$ of the NPN transistor, respectively. Further, an electrode 66 for isolation is formed on the region 65 (FIG. 6L).

Figure 6L:
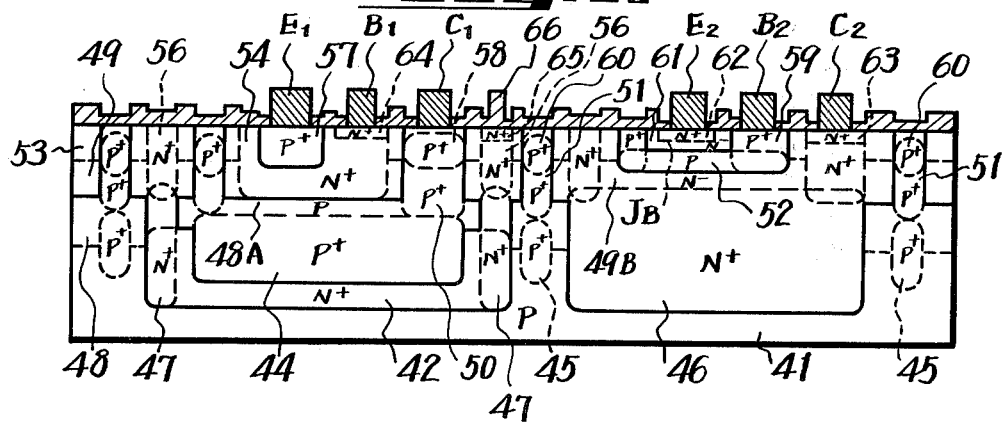

Thus, as shown in FIG. 6L, the PNP transistor PNP $Tr_1$ is formed in the first island region defined by the embedded region 42 and the isolation regions 47 and 56, whose collector region is made of a P type region 48A consisting of the P type region 44 and the first epitaxial growth layer 48, whose base region is made of the N type diffusion region 54 and whose emitter region is made of the P type region 57, while the NPN $Tr_2$ of the LEC type is formed in the second island region defined by the P type isolation regions 45, 51 and 60 whose collector region is made of a region 49B consisting of the second epitaxial growth layer 49, whose base region is made of the P type region 52 formed by the ion implantation and whose emitter region is made of the N type region 61 of low concentration which consists of the third epitaxial growth layer 53 and forms the LH junction $J_B$ with the N type region 62 of high impurity. That is, a semiconductor integrated circuit device is provided which has desired complementary transistors.

The semiconductor device described immediately above is substantially the same as that described in connection with FIGS. 5A to 5L. That is, with the PNP transistor PNP $Tr_1$ shown in FIG. 6L, its collector region is made of the P type region 48A of low concentration of the first epitaxial layer 48 and the P type embedded region 44 of high concentration and its base and emitter regions 54 and 57 are made by the double diffusion in the second and third epitaxial growth layers 49 and 53. Accordingly, the PNP transistor PNP $Tr_1$ is high in property, namely, its high frequency characteristic and current characteristic of its current amplification factor $h_{FE}$ are improved and the withstanding voltage across the collector junction thereof is made high.

As to the manufacture of the semiconductor integrated circuit device shown in FIG. 6, the P and N type epitaxial growth layers 48 and 49 are formed; the P type region 48A of low concentration and the P type region 44 of high concentration, which serve as the collector region of the PNP transistor, the N type region 49B of low impurity and the N type region 46 of high concentration which serve as the collector region of the PNP transistor, are formed by utilizing the difference of the diffusion lengths of the P type region 44 of middle concentration, for example, $10^{17} \sim 10^{18} \text{cm}^{-3}$ and the N type region 46 of high concentration, for example, $10^{20} \text{cm}^{-3}$, which were previously embedded into the substrate 41, to the P type epitaxial growth layer 48; then the base region 52 of the NPN transistor is formed; the third epitaxial growth layer 53 of N type is formed; and thereafter the base and emitter diffusions of the PNP transistor are deeply carried out. Further, upon the process of the emitter diffusion of the PNP transistor, the diffusion of impurity at high concentration forming the region for leading out the base electrode of the NPN transistor is carried out at the same time. Accordingly, such a semiconductor integrated circuit device can be made by a relatively small number of process steps.

FIG. 7 or FIGS. 7A to 7J show a further embodiment of the present invention in which such a semiconductor integrated circuit device having an LEC type of NPN transistor, a PNP transistor and a resistor.

Figure 7A:
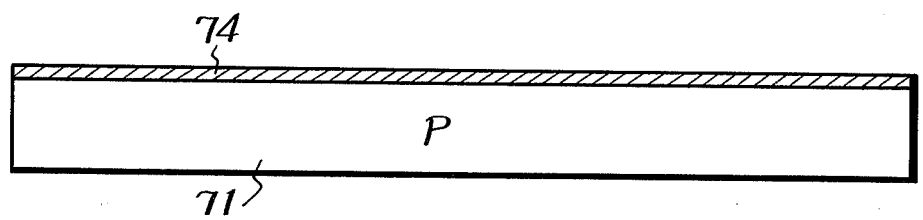
Figure 7B:
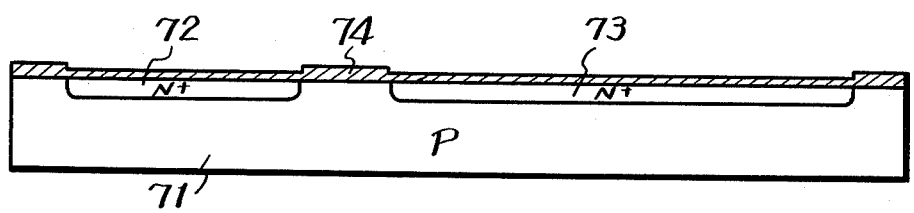
Figure 7C:
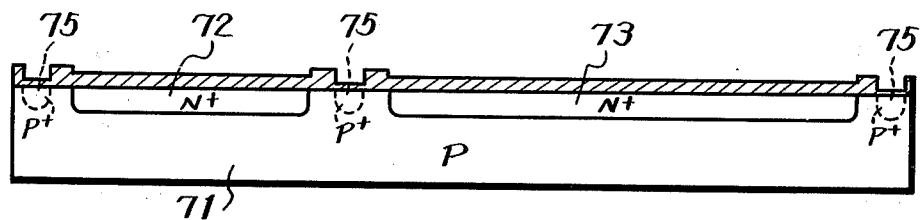

As shown in FIG. 7A, a P type semiconductor substrate 71 whose specific resistance is selected, for example, to be in the order of 3 to 5 Ω-cm is prepared. N type embedded layers 72 and 73, which are of high impurity concentration and have a sheet resistance $p_S$ of, for example, about 20 Ω/□, are formed by diffusion on the substrate 71 from the surface thereof at the location where an NPN transistor must be formed later and at the common location where a PNP transistor and a resistor must be formed later, respectively (Refer to FIG. 7B). In the figures, 74 indicates an insulating layer made of, for example, $SiO_2$.

Figure 7D:
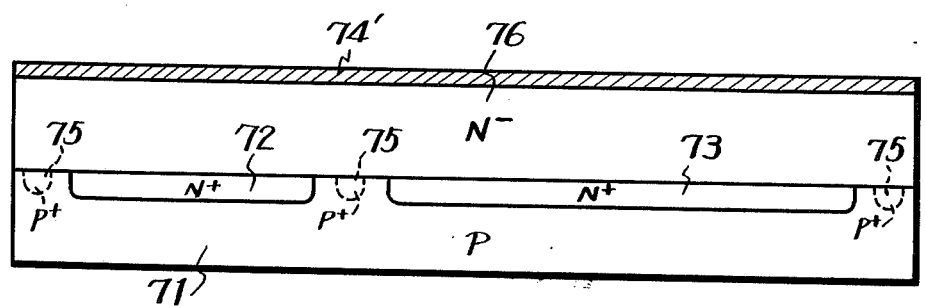

Then, a P type isolation region 75 is formed in the substrate 71 by diffusion for isolating the N type embedded layers 72 and 73 in such that it is shaped like a lattice when viewed from the upper side and its sheet resistance $p_S$ is selected about 10 Ω/□. Then, a first epitaxial growth layer 76 of N type is formed to cover all the substrate 71 whose specific resistance is selected, for example, about 4 to 7 Ω-cm (FIG. 7D). In FIG. 7D, 74' designates an insulating layer made, for example, of $SiO_2$.

Figure 7E:
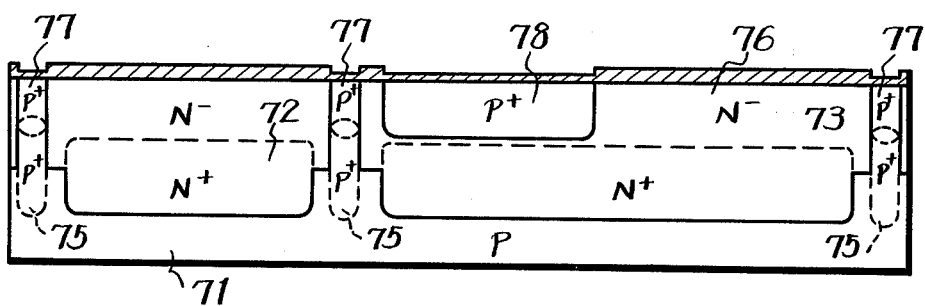

Thereafter, a P type impurity is selectively diffused into the N type epitaxial growth layer 76 to form therethrough a P type isolation region 77 at a location corresponding to the P type isolation region 75 which is connected to 77 through the layer 76, and at the same time a P type region 78 which will serve as the collector region of a PNP transistor to be formed later (FIG. 7E).

Figure 7F:
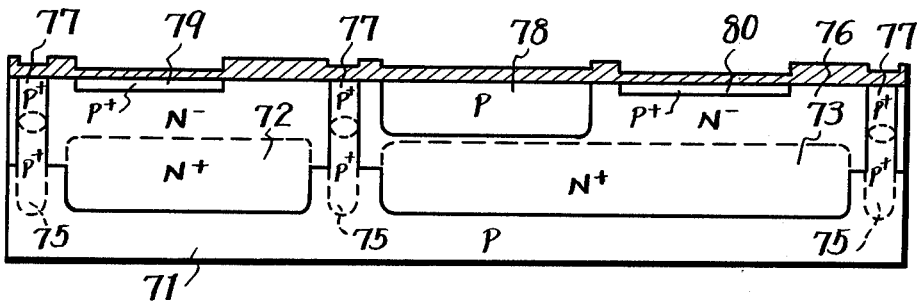

A P type region 79 is formed by diffusion in the N type epitaxial growth layer 76 at the location where the base region of an NPN transistor will be made, and at the same time or process a P type region 80 is formed in the layer 76 by diffusion at the location where a resistor is to be formed later. In this case, the regions 79 and 80 can be selected to have a sheet resistance of 1000 Ω/□ (FIG. 7F).

Figure 7G:
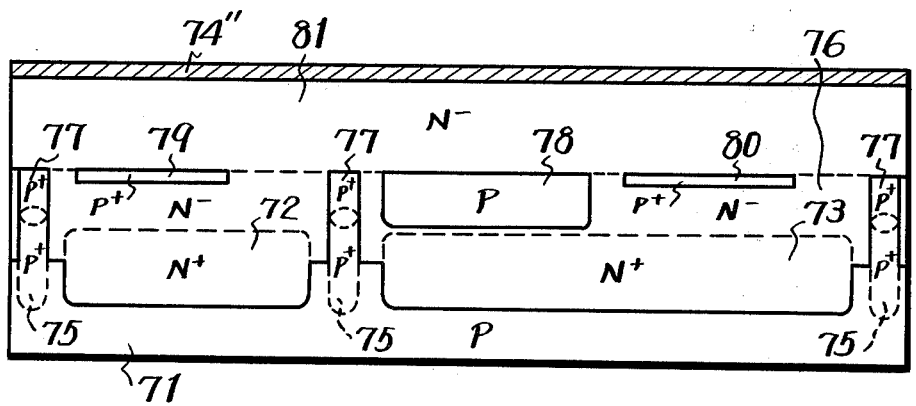

Thereafter, a second N type epitaxial growth layer 81 of the N type is formed on the N type epitaxial growth layer 76 (FIG. 7G).

Figure 7H:
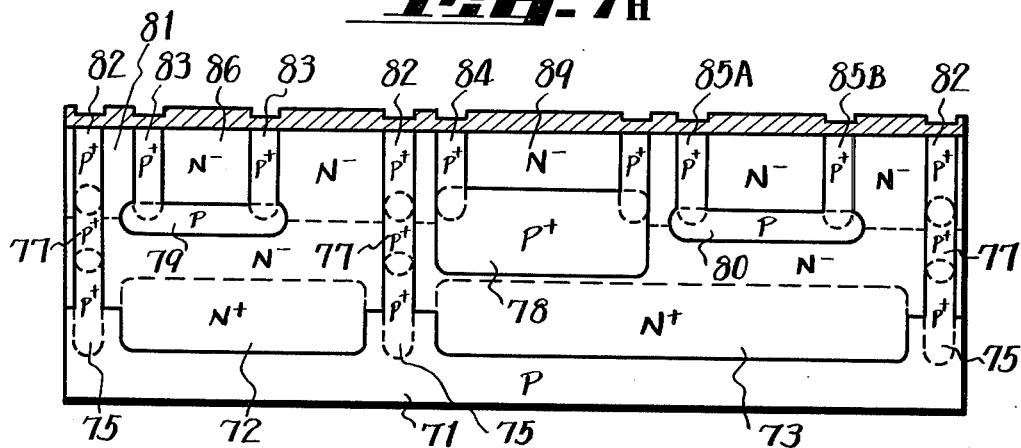

A P type impurity is, then, diffused into the second N type epitaxial growth layer 81 selectively to form a P type isolation region 82 which is connected to the isolation region 77; a P type region 83, which is connected to the P type region 70 and will be serve as part of the base region of the NPN transistor; a P type region 84, which is connected to the P type region 78 and will serve as a part of the collector region of the PNP transistor; and P type regions 85A and 85B which are connected to both ends of the P type region 80, which will be a resistor body, respectively (FIG. 7H).

Figure 7I:
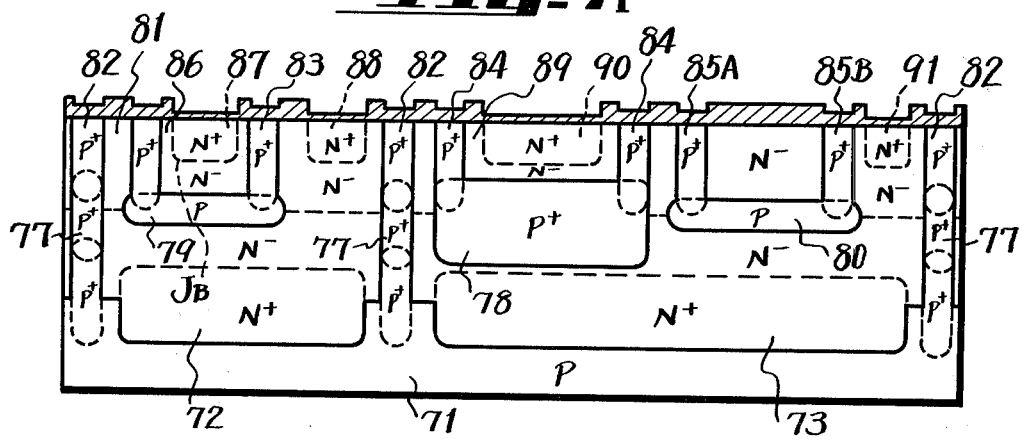

An N type impurity is selectively diffused into the P type second epitaxial layer 81 (whose sheet resistance is selected to be about 100 Ω/□) to form an N type region 88 of high concentration at the position, which will become the collector of the NPN transistor, for leading out its collector electrode; an N type region 87 of high concentration in an N type region 86, which will serve as the low concentration emitter, is surrounded by the base region 83 and forms an LH junction $J_B$ with the N type region 87; an N type region 90 of high concentration in the region which will become the base of the PNP transistor to provide an N type region 89 of low concentration between the region 90 and the P type region 78 which will become the collector of the PNP transistor; and an N type region 91 of high concentration in the N type region defined by the P type isolation region 82 and at the side where the PNP transistor and resistor are provided, which region 91 serves for the electrode severing as isolation, respectively (FIG. 7I).

A P type impurity is selectively diffused at high concentration into the second epitaxial growth layer 81 (with a sheet resistance of about 10 Ω/□) to form a P type region 92 of high concentration on the region 83, which will serve for deriving the base electrode of the NPN transistor; a P type region 93 of high concentration on the region 90, which will become the emitter of the PNP transistor; a P type region 94 of high concentration on the region 84, which will serve for deriving the collector electrode of the PNP transistor; and P type regions 95A and 95B of high concentration on the regions 85A and 85B, which will serve for deriving the electrodes of the P type region 80 which will become the resistor.

Thereafer, an emitter electrode $E_2$, a base electrode $B_2$ and a collector electrode $C_2$ of the NPN transistor are formed on the regions 87, 92 and 88, an emitter electrode $E_1$, a base electrode $B_1$ and a collector electrode $C_1$ of the PNP transistor are formed on the regions 93, 90 and 94; a pair of electrodes $R_1$ and $R_2$ are formed on the regions 95A and 95B; and an electrode 96 is formed on the region 91, respectively.

Figure 7J:
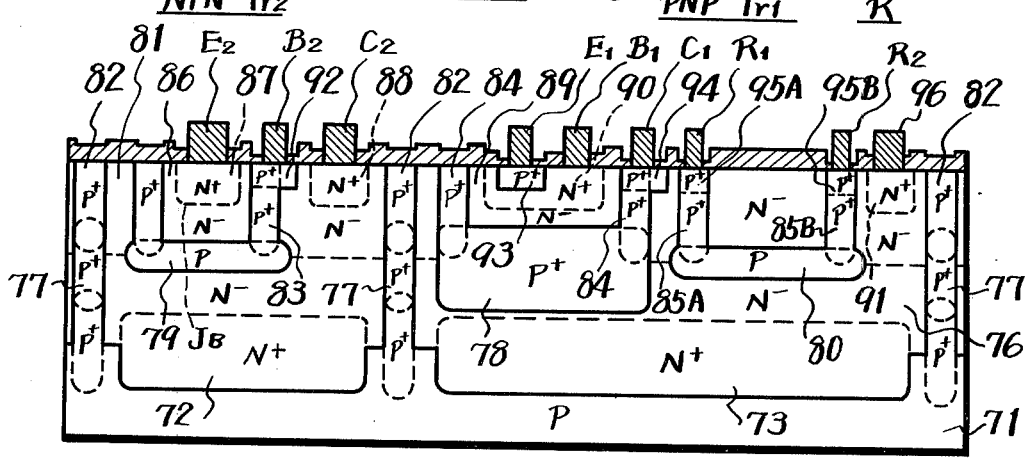

Thus, as shown in FIG. 7J, a semiconductor integrated circuit device is provided. In this case, it has an NPN transistor NPN $Tr_2$ of LEC type whose collector region is made of parts of the first and second epitaxial growth layers 76 and 81 which is surrounded by the P type isolation regions 82 and 77, whose base region is made of the P type region 79 and whose emitter region is made of the N type region 86 of low concentration which consists of the second epitaxial growth layer 81 and forms an LH junction $J_B$ with the N type region 87 of high concentration; a PNP transistor PNP $Tr_1$ whose collector region is made of the P type region 78, whose base region is made of the N type region 89 of low concentration consisting of the second epitaxial growth layer 81 and the N type diffusion region 90 of high concentration and whose emitter region is made of the P type diffusion region 93 of high concentration; and a resistor R is made of the P type region 80, respectively.

Accordingly to the semiconductor integrated circuit device of the invention described just above, a PNP transistor of high property is obtained, together with an NPN transistor of high property similar to those shown in FIGS. 5 and 6. That is, although a description on the NPN transistor will be omitted, the base region 90 and emitter region 93 of the PNP transistor PNP $Tr_1$ are formed by double diffusions into the second epitaxial growth layer 81, so that its high frequency characteristic and the current characteristic of its factor $h_{FE}$ are improved. Further, since the base region of the PNP transistor, which contacts with its collector region, is made of the region 89 of low concentration consisting of the second epitaxial growth layer 81, its withstanding voltage across the collector junction is improved. In addition, the part of the base region apart from the collector junction consists of the region 90 of high concentration, so that the punch-through upon the operation can be avoided to increase its withstanding voltage.

As described in the foregoing, with the semiconductor integrated circuit device of the present invention, it has provided with the PNP transistor of high property or of high withstanding voltage and superior in high frequency and current characteristics as well as the NPN transistor of LEC type and hence good complementary transistors.

Further, with the present invention, since the PNP transistor PNP $Tr_1$ coexists with the NPN transistor NPN $Tr_2$ of LEC type, it is easy to introduce an LEC transistor into a semiconductor integrated circuit device.

The foregoing description is given on the case that the NPN transistor is made as an LEC type, but it is also possible that an ordinary NPN transistor with the emitter of high concentration be used as the NPN transistor of the invention.

Further, the NPN transistors formed in the examples shown in FIGS. 5 to 7 include the LH junction, but they can be made to have the form of the construction shown in FIGS. 3 and 4.

It will be apparent to those skilled in the art that many modifications and variations may be effected without departing from the spirit and scope of the novel concepts of the present invention.

We claim as our invention:

1. A semiconductor integrated circuit having first and second transistors of opposite conductivity type, comprising:
    a. a semiconductor substrate of a first conductivity type;
    b. an epitaxial layer formation of a second conductivity type and relatively low impurity concentration formed on said substrate and having a major face opposite the substrate;
    c. said first transistor comprising:
        i. a first region of first conductivity type in said epitaxial layer of formation spaced below said major face, and a conductive path region of first conductivity type and higher impurity concentration than said first region extending from the first region up to the major face;
        ii. a second region of second conductivity type being formed of said epitaxial layer formation and partially surrounded by said first region and conductive path region; and
        iii. a third region of first conductivity type formed in said second region spaced from said first region by said second region;
    d. an isolating PN junction between said first transistor and said second transistor, said second transistor comprising:
        i. a fourth region of second conductivity type formed of a portion of said epitaxial layer formation isolated from the first transistor by the isolating PN junction;
        ii. a fifth region of first conductivity type spaced below said major face; and a conductive path region of first conductivity type and higher impurity concentration than said fifth region from the fifth region up to the major face;
        iii. a sixth region of second conductivity type being formed of said relatively low concentration epitaxial layer formation and partially surrounded by said fifth region and conductive path region, said sixth region being spaced from said fourth region by said fifth region; and
        iv. a seventh region of second conductivity type and concentration relatively higher than said sixth region formed in said sixth region and forming a low-high concentration barrier junction therewith, said junction being spaced from said fifth region by a distance less than the diffusion length of minority carriers in said sixth region injected from said fifth region when a forward bias is applied between said fifth and sixth regions;

whereby a first transistor is formed in an integrated circuit with a second transistor of low emitter concentration.

2. The integrated circuit of claim 1 in which a diffused portion of second conductivity type and concentration higher than said first transistor second region is formed in said second region to extend at least between said first region and third region, whereby said first transistor has a base of high impurity concentration and high breakdown voltage.

3. The integrated circuit of claim 1 in which the impurity concentration and gradient of said low-high junction is selected to have an electric field such that a drift current of minority carriers produced thereby substantially balances said diffusion current of minority carriers injected from the fifth region.

4. A semiconductor integrated circuit having first and second transistors of opposite conductivity type, comprising:
   a. a semiconductor substrate of a first conductivity type;
   b. an epitaxial layer formation of a second conductivity type and relatively low concentration formed on said substrate and having a major face opposite substrate;
   c. a first conductivity type isolation region in said epitaxial layer formation from said major face down to said substrate;
   d. a first transistor formed on one side of said isolation region comprising:
      i. a first embedded region of second conductivity type formed in said substrate,
      ii. a second embedded region of first conductivity type formed in said first embedded region and extending upwardly in said epitaxial layer formation,
      iii. a first region of first conductivity type formed in said epitaxial layer formation spaced below said major face and in contact with said second embedded region, and a conductive path region of first conductivity type and higher impurity concentration than said first region from the first region up to the major face,
      iv. a second region of second conductivity type being formed of said epitaxial layer formation and partially surrounded by said first region and conductive path region,
      v. a diffused region of second conductivity type and relatively higher concentration formed in said second region between said first region and major face,
      vi. a third region of first conductivity type formed in said diffusion region and spaced from said first region by said diffusion region,
   e. a second transistor formed on the other side of said isolation region comprising:
      i. a third embedded region of second conductivity type formed in said substrate,
      ii. a fourth region of second conductivity type and lower concentration than said third embedded region formed by said epitaxial layer formation in contact with said third embedded region,
      iii. a fifth region of first conductivity type in said fourth region spaced below said epitaxial layer formation major face and a conductive path region of first conductivity type and higher impurity concentration than said fifth region from the fifth region up to the major face,
      iv. a sixth region of second conductivity type being formed of said epitaxial layer formation of relatively low concentration and partially surrounded by said fifth region and conductive path region, said sixth region being spaced from said fourth region by said fifth region, and
      v. a seventh region of second conductivity type and concentration relatively higher than said sixth region formed in said sixth region and forming a low-high concentration barrier junction therewith, said junction being spaced from said fifth region by a distance less than the diffusion length of minority carriers in said sixth region injected from said fifth region when a forward-bias is applied between said fifth and sixth regions,
   whereby a first transistor of relatively high base concentration is formed with a second transistor of low emitter concentration.

5. The integrated circuit of claim 4 in which the first transistor first region first portion has an impurity concentration relatively lower than impurity concentration of said second embedded region whereby a low concentration collector region is formed adjacent a base in said first transistor.

* * * * *